United States Patent
Cai

(10) Patent No.: US 11,527,690 B2
(45) Date of Patent: Dec. 13, 2022

(54) SUBSTRATE, DISPLAY PANEL AND ASSEMBLY DETECTION METHOD THEREOF

(71) Applicant: Hubei Yangtze Industrial Innovation Center Of Advanced Display Co., Ltd., Wuhan (CN)

(72) Inventor: Yu Cai, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 190 days.

(21) Appl. No.: 17/009,950

(22) Filed: Sep. 2, 2020

(65) Prior Publication Data

US 2021/0408349 A1 Dec. 30, 2021

(30) Foreign Application Priority Data

Jun. 30, 2020 (CN) .......................... 202010619724.X

(51) Int. Cl.
*H01L 33/62* (2010.01)
*H01L 27/15* (2006.01)
*H01L 33/38* (2010.01)
*H01L 33/44* (2010.01)
*H01L 33/54* (2010.01)

(52) U.S. Cl.
CPC ............ *H01L 33/62* (2013.01); *H01L 27/156* (2013.01); *H01L 33/38* (2013.01); *H01L 33/44* (2013.01); *H01L 33/54* (2013.01)

(58) Field of Classification Search
CPC combination set(s) only.
See application file for complete search history.

(56) References Cited

U.S. PATENT DOCUMENTS

| | | | |
|---|---|---|---|
| 8,791,474 B1 * | 7/2014 | Bibi | G09G 3/2003 257/89 |
| 10,700,120 B2 * | 6/2020 | Chaji | H01L 24/97 |
| 2020/0328196 A1 * | 10/2020 | Han | H01L 25/167 |

FOREIGN PATENT DOCUMENTS

| | | |
|---|---|---|
| CN | 105655366 A | 6/2016 |
| CN | 106206651 A | 12/2016 |
| CN | 108591974 A | 9/2018 |

* cited by examiner

*Primary Examiner* — Mark W Tornow
*Assistant Examiner* — Priya M Rampersaud
(74) *Attorney, Agent, or Firm* — Anova Law Group, PLLC

(57) ABSTRACT

Substrate, display panel and assembly detection method thereof are provided. The substrate includes a supporting base and a plurality of sub-pixel areas arranged in an array. A main conductive pad unit and a spare conductive pad unit are formed on the supporting base in each sub-pixel area. An anti-reflection layer is disposed on a side of the supporting base adjacent to the main conductive pad unit and the spare conductive pad unit. An orthographic projection of the anti-reflection layer on the supporting base at least covers an orthographic projection of the spare conductive pad unit on the supporting base.

16 Claims, 10 Drawing Sheets

200

30

30

SUBSTRATE, DISPLAY PANEL AND ASSEMBLY DETECTION METHOD THEREOF

CROSS-REFERENCES TO RELATED APPLICATIONS

This application claims priority of Chinese Patent Application No. 202010619724.X, filed on Jun. 30, 2020, the entire contents of which are hereby incorporated by reference.

FIELD OF THE DISCLOSURE

The present disclosure generally relates to the field of display technology and, more particularly, relates to a substrate, a display panel and an assembly detection method thereof.

BACKGROUND

Micro LED or Mini LED products are often bonded to a substrate. In a mass transfer process, if it is detected that some of the Micro LEDs or Mini LEDs do not emit light, they cannot be repaired at their original binding positions. Instead, alternate binding positions are set at the normal binding positions. Once those non-emitting micro LED or Mini LED products are detected, they are repaired at the alternate binding positions. When the alternate binding positions are introduced on the substrate, the alternate binding positions may increase reflectivity of the substrate. However, polarizers cannot be used to reduce reflectivity of the substrate, because Micro LED or Mini LED products usually do not include polarizers. Therefore, how to reduce an increase in substrate reflectivity due to an introduction of alternate binding positions has become one of the technical problems to be solved urgently.

BRIEF SUMMARY OF THE DISCLOSURE

One aspect of the present disclosure provides a substrate. The substrate includes a supporting base and a plurality of sub-pixel areas arranged in an array. A main conductive pad unit and a spare conductive pad unit are formed on the supporting base in each sub-pixel area. An anti-reflection layer is disposed on a side of the supporting base adjacent to the main conductive pad unit and the spare conductive pad unit. An orthographic projection of the anti-reflection layer on the supporting base at least covers an orthographic projection of the spare conductive pad unit on the supporting base.

Another aspect of the present disclosure provides a display panel. The display panel includes a substrate and a plurality of light-emitting elements. The substrate includes a supporting base and a plurality of sub-pixel areas arranged in an array. A main conductive pad unit and a spare conductive pad unit are formed on the supporting base in each sub-pixel area. An anti-reflection layer is disposed on a side of the supporting base adjacent to the main conductive pad unit and the spare conductive pad unit. An orthographic projection of the anti-reflection layer on the supporting base at least covers an orthographic projection of the spare conductive pad unit on the supporting base. The plurality of light-emitting elements are disposed in one-to-one correspondence with the plurality of sub-pixel areas. The light-emitting element is disposed on a side of the anti-reflection layer away from the supporting base. The light-emitting element is electrically connected to the main conductive pad unit or the spare conductive pad unit in the sub-pixel area.

Another aspect of the present disclosure provides an assembly detection method of a display panel including a substrate and a plurality of light-emitting elements. The substrate includes a supporting base and a plurality of sub-pixel areas arranged in an array. A main conductive pad unit and a spare conductive pad unit are formed on the supporting base in each sub-pixel area. An anti-reflection layer is disposed on a side of the supporting base adjacent to the main conductive pad unit and the spare conductive pad unit. The plurality of light-emitting elements are disposed in one-to-one correspondence with the plurality of sub-pixel areas. A main conductive pad unit and a spare conductive pad unit in a same sub-pixel area are electrically connected to a same driving circuit. The method includes: forming an anti-reflection layer on a side of the spare conductive pad unit facing towards the supporting base of the display panel, so that an orthographic projection of the anti-reflection layer on the supporting base at least covers an orthographic projection of the spare conductive pad unit on the supporting base; electrically connecting each light-emitting element to the main conductive pad unit; detecting light emissions of all of the plurality of light-emitting elements, if there is a light-emitting element in at least one sub-pixel area of the plurality of sub-pixel areas that does not emit light, removing the light-emitting element that does not emit light, or disconnecting an electrical connections between the driving circuit and the main conductive pad unit in the at least one sub-pixel area; and electrically connecting a spare light-emitting element to the spare conductive pad unit in the at least one sub-pixel area.

Other aspects or embodiments of the present disclosure can be understood by those skilled in the art in light of the description, the claims, and the drawings of the present disclosure.

BRIEF DESCRIPTION OF THE DRAWINGS

Accompanying drawings incorporated in the specification and constituting part of the specification illustrate embodiments of the present disclosure, and together with a description are used to explain principles of the present disclosure.

DETAILED DESCRIPTION

Various exemplary embodiments of the present disclosure are now be described in detail with reference to accompanying drawings. Unless specifically stated otherwise, relative arrangement of components and steps, numerical expressions and numerical values set forth in the embodiments do not limit the scope of the present disclosure.

The following description of at least one exemplary embodiment is only illustrative, and in no way serves as any limitation to the present disclosure and its applications or uses.

Techniques, methods and equipment known to those skilled in the art may not be discussed in detail, but where appropriate, the techniques, methods and equipment should be regarded as part of the specification.

In all examples shown and discussed herein, any specific value should be construed as merely exemplary but not as limiting. Therefore, other examples of the exemplary embodiment may have different values.

Similar numbers and letters indicate similar items in the following accompanying drawings. So once an item is defined in one accompanying drawing, it does not need to be discussed further in subsequent accompanying drawings.

Figure 1:
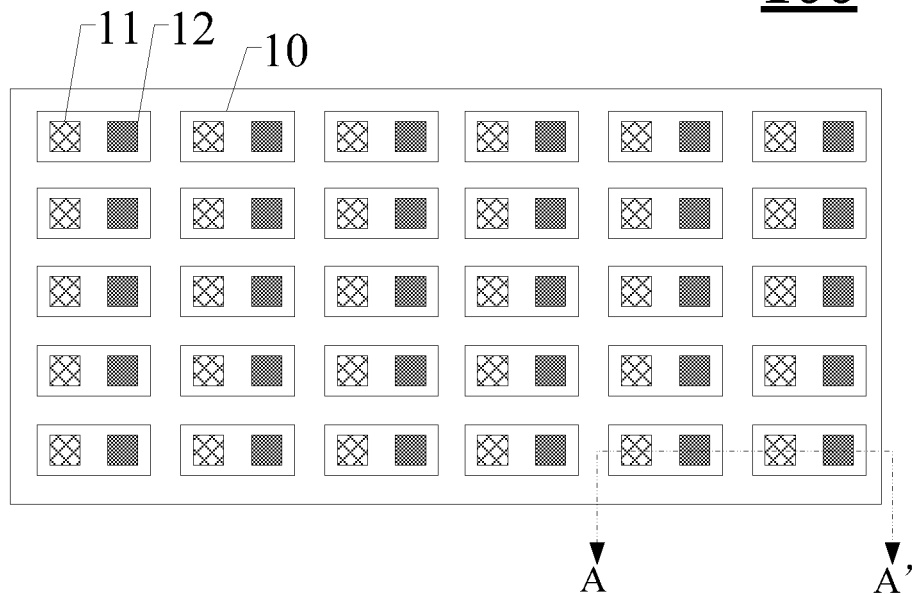
FIG. 1 illustrates a top view of an exemplary substrate consistent with various disclosed embodiments of the present disclosure.
Figure 2:
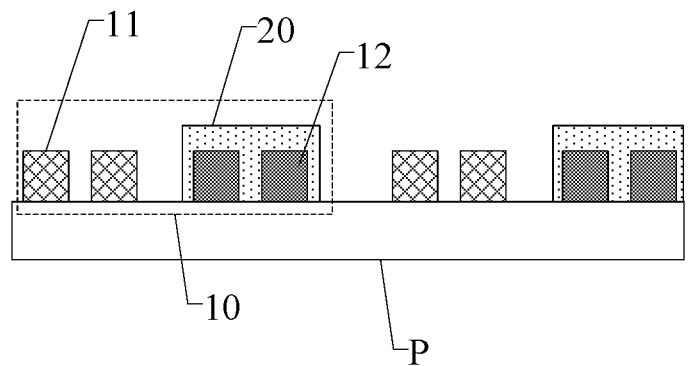
FIG. 2 illustrates an AA' cross-sectional view of the substrate in FIG. 1.

FIG. 1 illustrates a top view of an exemplary substrate consistent with various disclosed embodiments of the present disclosure. FIG. 2 illustrates an AA' cross-sectional view of the substrate in FIG. 1. Referring to FIGS. 1 and 2, a substrate 100 includes a plurality of sub-pixel areas 10 arranged in an array. Each sub-pixel area 10 includes a main conductive pad unit 11 and a spare conductive pad unit 12 on the supporting base P. An anti-reflection layer 20 is disposed on a side of the supporting base P adjacent to the main conductive pad unit 11 and the spare conductive pad unit 12. An orthographic projection of the anti-reflection layer 20 on the supporting base P at least covers an orthographic projection of the spare conductive pad unit 12 on the supporting base P.

For illustrative purposes, FIG. 1 only illustrates part of the sub-pixel areas 10 on the substrate 100, which does not represent an actual number of the sub-pixel areas 10 on the substrate 100. In addition, the main conductive pad unit 11 and the spare conductive pad unit 12 in each sub-pixel area 10 are only illustrative, and do not represent actual sizes of the main conductive pad unit 11 and the spare conductive pad unit 12. FIG. 2 only takes each of the main conductive pad unit 11 and the spare conductive pad unit 12 including two conductive pads as an example for description. Light-emitting elements corresponding to the main conductive pad units 11 and the spare conductive pad units 12 of the above structure shown in FIG. 2 are light-emitting elements of a flip-chip structure. That is, two electrodes in the light-emitting element are on a same side of the light-emitting element. When the light-emitting element is electrically connected to the main conductive pad unit 11 or the spare conductive pad unit 12 of the flip-chip structure, the two electrodes of the light-emitting element are respectively electrically connected to the two conductive pads in the main conductive pad unit 11. Alternatively, the two electrodes of the light-emitting element are respectively electrically connected to two conductive pads in the spare conductive pad unit 12. In some other embodiments, number of conductive pads in the main conductive pad unit 11 and the spare conductive pad unit 12 may be one, which is described in subsequent embodiments.

Figure 8:
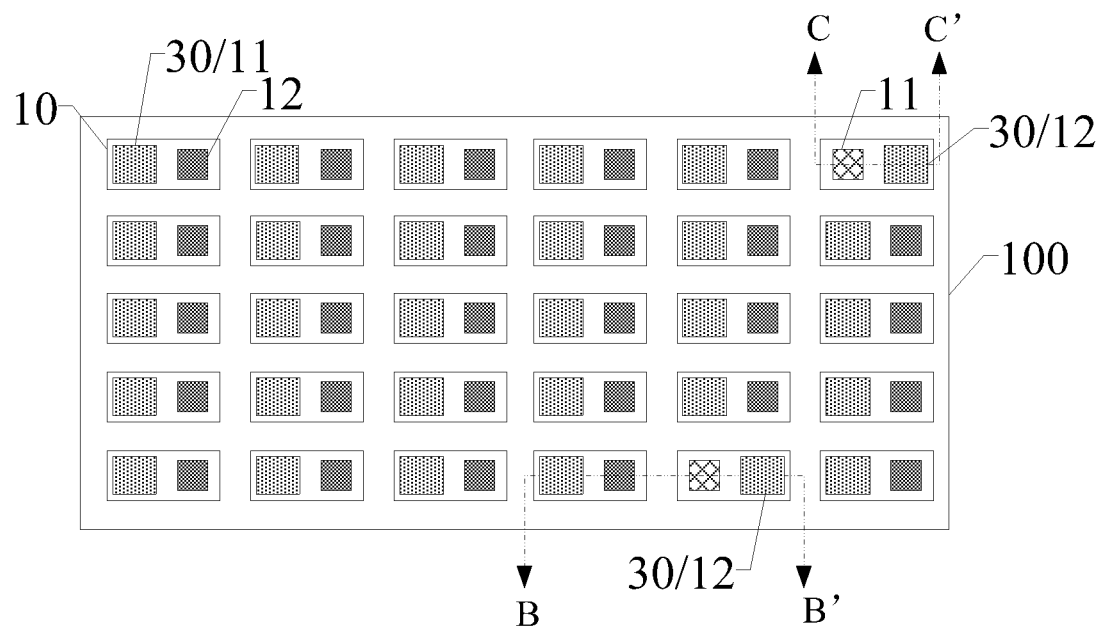
FIG. 8 illustrates a top view of an exemplary display panel consistent with various disclosed embodiments of the present disclosure.

Referring to FIG. 1 and FIG. 2, the substrate 100 includes the plurality of sub-pixel areas 10 arranged in an array. Each sub-pixel area 10 includes the main conductive pad unit 11 and the spare conductive pad unit 12. The main conductive pad unit 11 in the substrate 100 is used to bind a light-emitting element (e.g. light-emitting element 30 as shown in FIG. 8) to form a display panel. When the light-emitting element bound to the main conductive pad unit 11 cannot emit light normally, a new light-emitting element can be bound to the corresponding spare conductive pad unit 12 to realize repair of the display panel. It should be noted that the substrate 100 may refer to an intermediate product that has not yet been bound with the light-emitting element. Generally, the main conductive pad units 11 and the spare conductive pad units 12 on the substrate 100 are metal pads. All the metal pads have a certain reflectivity. When a large number of spare conductive pad units 12 are introduced into the substrate 100, a reflectivity of the substrate 100 may inevitably increase. In the substrate 100, the anti-reflection layers 20 are disposed on a side of the spare conductive pad unit 12 away from the supporting base P. An orthographic projection of the anti-reflection layers 20 on the supporting base P at least covers an orthographic projection of the spare conductive pad units 12 on the supporting base P. That is, at least part of the anti-reflection layers 20 are disposed on surfaces of the spare conductive pad units 12 away from the supporting base P, thereby effectively avoiding an increase in the reflectivity of the substrate 100 due to an introduction of the spare conductive pad units 12 on the substrate 100. Therefore, it is conducive to reduce an overall reflectivity of the substrate 100 and improve display effect after binding the light-emitting elements on the substrate 100.

Figure 3:
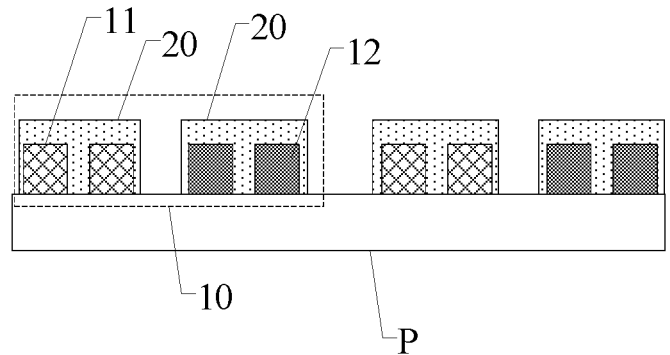
FIG. 3 illustrates another AA' cross-sectional view of the substrate in FIG. 1.

Optionally, in one embodiment, FIG. 3 illustrates another AA' cross-sectional view of the substrate in FIG. 1. FIG. 3 illustrates another relative positional relationship between the anti-reflection layer 20 and the main conductive pad unit 11 and the spare conductive pad unit 12. An orthographic projection of the anti-reflection layer 20 on the supporting base P further covers an orthographic projection of the main conductive pad unit 11 on the supporting base P.

Specifically, referring to FIG. 3, the anti-reflection layer 20 not only covers a surface of the spare conductive pad unit 12 away from the supporting base P, but also covers a surface of the main conductive pad unit 11 away from the supporting base P. Therefore, the anti-reflection layer 20 can further shield the surface of the main conductive pad unit 11 that may reflect light, thereby helping to reduce an increase in the reflectivity to the substrate 100 due to the main conductive pad unit 11. The anti-reflection layers 20 are disposed on sides of the main conductive pad unit 11 and the spare conductive pad unit 12 away from the supporting base P, thereby helping to reduce the reflectivity of the substrate 100, and helping to improve display effect of a display panel when the substrate 100 is applied to the display panel.

Referring to FIG. 3, the anti-reflection layers 20 are only disposed on surfaces of the main conductive pad unit 11 and the spare conductive pad unit 12 away from the supporting base P. However, an area between the main conductive pad unit 11 and the spare conductive pad unit 12 is not provided with an anti-reflection layer. A gap is formed between the main conductive pad unit 11 and the spare conductive pad unit 12. The gap acts to isolate the anti-reflection layers 20 on the surfaces of the main conductive pad unit 11 and the spare conductive pad unit 12. When the main conductive pad unit 11 and the spare conductive pad unit 12 are provided with anti-reflection layers of different materials on surfaces away from the supporting base P, for example, one is a photolytic material and the other is a pyrolytic material. When processing one of the two materials such as the photolysis material, due to an isolation effect of the gap, an impact of the photolysis process on the pyrolysis material can be reduced.

Figure 4:
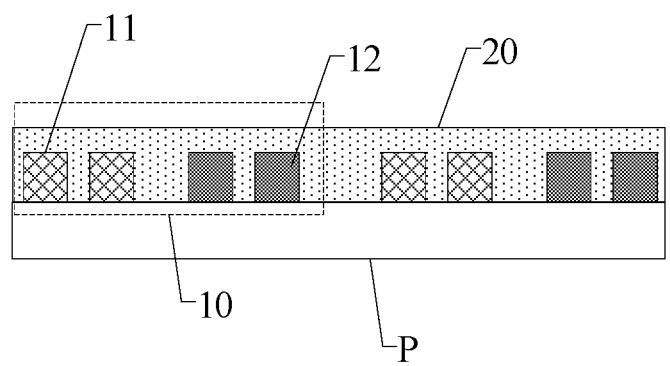
FIG. 4 illustrates another AA' cross-sectional view of the substrate in FIG. 1.

Optionally, in one embodiment, FIG. 4 illustrates another AA' cross-sectional view of the substrate in FIG. 1. FIG. 4 illustrates another relative positional relationship between the anti-reflection layer 20 and the main conductive pad unit 11 and the spare conductive pad unit 12 in the substrate 100. The orthographic projection of the anti-reflection layer 20 on the supporting base P further covers an entire surface of the supporting base P.

Referring to FIG. 4, the anti-reflection layer 20 further covers other areas on the supporting base P except the main conductive pad unit 11 and the spare conductive pad unit 12. Coverage areas of the anti-reflection layer 20 are increased, thereby reducing a reflection possibility of the substrate 100 after being applied to a display panel to a greatest extent, and improving display effect of the display panel 200 after the substrate 100 is applied to the display panel 200.

Figure 5:
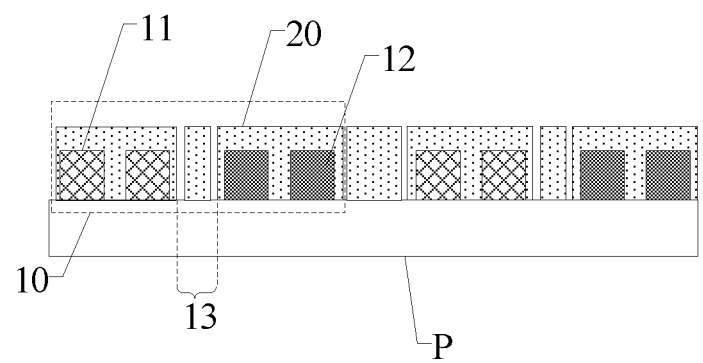
FIG. 5 illustrates another AA' cross-sectional view of the substrate in FIG. 1.

Optionally, in one embodiment, FIG. 5 illustrates another AA' cross-sectional view of the substrate in FIG. 1. FIG. 5 illustrates another relative positional relationship between the anti-reflection layer 20 and the main conductive pad unit 11 and the spare conductive pad unit 12. The sub-pixel area 10 further includes a first area 13 between the main conductive pad unit 11 and the spare conductive pad unit 12. The anti-reflection layer 20 in the first area 13 is not connected to the anti-reflection layer 20 on the side of the spare conductive pad unit 12 away from the supporting base P.

Specifically, referring to FIG. 5, in the sub-pixel area 10 on the supporting base P of the display panel 200, except an area where the main conductive pad unit 11 and the spare conductive pad unit 12 are disposed, the display panel 200 further includes the first area 13 between the main conductive pad unit 11 and the spare conductive pad unit 12. When the anti-reflection layers 20 are disposed in both the sub-pixel area 10 and the first area 13, the anti-reflection layer 20 in the first area 13 is disconnected from the anti-reflection layer 20 on the side of the spare conductive pad unit 12 away from the supporting base P. For example, in FIG. 5, a gap is formed between the anti-reflection layer 20 in the first area 13 and the anti-reflection layer 20 corresponding to the spare conductive pad unit 12. Therefore, the anti-reflection layers 20 on sides of the first area 13 and the spare conductive pad unit 12 away from the supporting base P can be made of different materials according to actual needs. Moreover, when it is necessary to remove the anti-reflection layer 20 on the side of the spare conductive pad unit 12 away from the supporting base P by photolysis or thermal decomposition, disconnecting the first area 13 and the spare conductive pad unit 12 is conducive to ensure that a process of photolysis or thermal decomposition does not affect the anti-reflection layer 20 in the first area 13. Therefore, the anti-reflection layer 20 in the first area 13 can be used as an isolation layer. Since the anti-reflective layer 20 in the first area 13 does not need to be pyrolyzed or photolyzed, the anti-reflective layer 20 in the first area 13 can be made of non-pyrolytic material or non-photolytic material. That is, different materials can be used for the anti-reflection layers corresponding to the spare conductive pad unit 12 and the main conductive pad unit 11 respectively. Due to an isolation effect of the anti-reflection layer 20 in the first area 13, when one of the anti-reflection layer 20 corresponding to the spare conductive pad unit 12 and the anti-reflection layer 20 corresponding to the main conductive pad unit 11 needs to be pyrolyzed or photo-decomposed, the other anti-reflection layer 20 corresponding to the spare conductive pad unit 12 or corresponding to the main conductive pad unit 11 is not affected.

Except the sub-pixel areas 10, the substrate 100 further includes non-sub-pixel areas. When an anti-reflection layer 20 is disposed in the non-sub-pixel area, the anti-reflection layer 20 in the non-sub-pixel area and the anti-reflection layer 20 in the first area 13 can be connected and can be made of a same material. On one hand, a production process of the anti-reflective layer 20 can be simplified. On the other hand, the anti-reflective layer 20 in the first area 13 and the non-sub-pixel area can reliably play a role of anti-reflection. The anti-reflective layer in the first area can be disconnected from the anti-reflective layer corresponding to the spare conductive pad unit by a exposure process, a printing, or a silk screen printing.

Optionally, in one embodiment, referring to FIGS. 2-5, in the substrate 100, in a direction perpendicular to a surface of the supporting base P, a thickness of the anti-reflection layer 20 is at least greater than a thickness of the spare conductive pad unit 12. It is conducive to ensure that the anti-reflection layer 20 can reliably cover a surface of the spare conductive pad unit 12 away from the substrate P, so that the anti-reflection layer 20 can effectively perform an anti-reflection function.

Optionally, in one embodiment, the anti-reflection layer 20 is black and includes a photolysis material and a pyrolysis material. The black photolytic or pyrolytic material includes an organic resin or colloid doped with carbon black, a black photoresist or s black matrix material or other material with anti-reflection properties. The photolysis material decomposes when irradiated with light of a certain energy. The pyrolyzed material decomposes when heated at a certain temperature.

Figure 6:
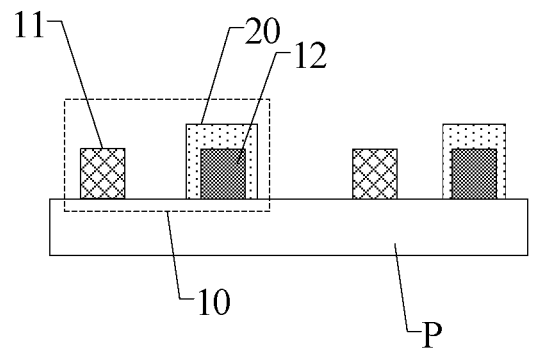
FIG. 6 illustrates another AA' cross-sectional view of the substrate in FIG. 1.
Figure 7:
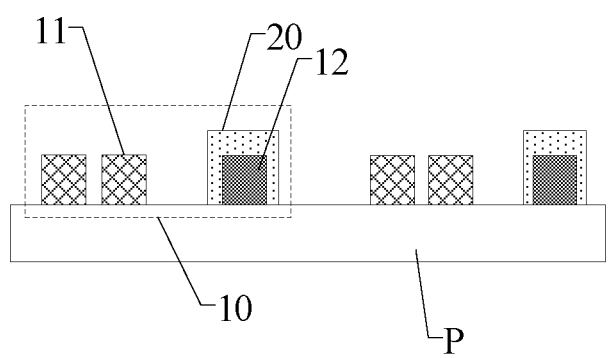
FIG. 7 illustrates another AA' cross-sectional view of the substrate in FIG. 1.

Optionally, in one embodiment, referring to FIGS. 6-7, FIG. 6 illustrates another AA' cross-sectional view of the substrate in FIG. 1 and FIG. 7 illustrates another AA' cross-sectional view of the substrate in FIG. 1. The main conductive pad unit 11 includes one or two conductive pads, and the spare conductive pad unit 12 includes one or two conductive pads.

Referring to FIG. 6, in a structure of the substrate 100, the main conductive pad unit 11 and the spare conductive pad unit 12 may each include only one conductive pad. A light-emitting element corresponding to the substrate 100 of the structure is a light-emitting element with a vertical structure. That is, two electrodes in the light-emitting element 30 are respectively on two sides of the light-emitting element. When the light-emitting element is electrically connected to the main conductive pad unit 11 or the spare conductive pad unit 12 in the substrate 100 of the structure, an electrode in the light-emitting element 30 is electrically connected to a conductive pad in the main conductive pad unit 11 or the spare conductive pad unit 12. In some other embodiments, numbers of conductive pads in the main conductive pad unit 11 and the spare conductive pad unit 12 may be different. One of the main conductive pad unit 11 and the spare conductive pad unit 12 may include one conductive pad, and the other of the main conductive pad unit 11 and the spare conductive pad unit 12 may include two conductive pads. Referring to FIG. 7, in one embodiment, the main conductive pad unit 11 includes two conductive pads, and the spare conductive pad unit 12 includes one conductive pad. In some other embodiments, in the substrate 100, the main conductive pad unit 11 includes one conductive pad, and the spare conductive pad unit 12 includes two conductive pads.

Figure 9:
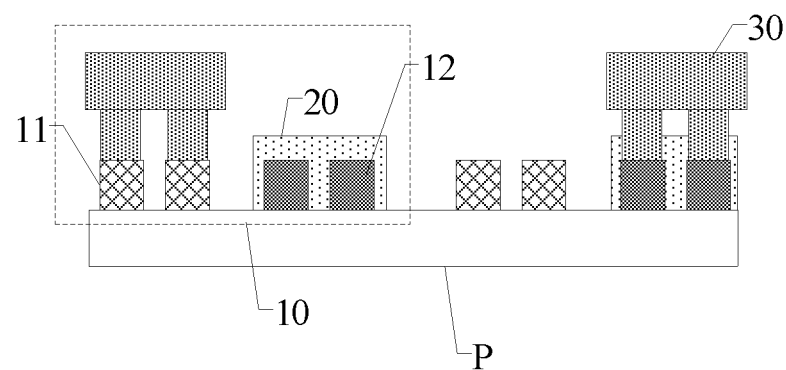
FIG. 9 illustrates a BB' cross-sectional view of the display panel in FIG. 8.

Based on a same inventive concept, a display panel 200 is provided in one embodiment, FIG. 8 illustrates a top view of the display panel 200 consistent with various disclosed embodiments of the present disclosure. FIG. 9 illustrates a BB' cross-sectional view of the display panel in FIG. 8. The display panel 200 includes a plurality of light-emitting elements 30 and the substrate 100 provided by any of the above embodiments.

The plurality of light-emitting elements 30 are disposed in one-to-one correspondence with the plurality of sub-pixel areas 10. The light emitting element 30 is disposed on a side of the anti-reflection layer 20 away from the supporting base P. The light-emitting element 30 is electrically connected to the main conductive pad unit 11 or the spare conductive pad unit 12 in the sub-pixel area 10.

Specifically, referring to FIG. 8 and FIG. 9, the display panel 200 incorporates the light-emitting elements 30 based on the substrate 100 provided in the above embodiment. The light-emitting elements 30 are electrically connected to the main conductive pad units 11 or the spare conductive pad units 12 on the substrate 100. The light-emitting elements 30 are transferred to the substrate 100 by means of mass transfer. Electrical connections are formed between the light-emitting elements 30 and the main conductive pad units 11 on the substrate 100. After the electrical connections are completed, light emissions of the light-emitting elements 30 are detected. When one or some of the light-emitting elements 30 cannot emit light, new light-emitting elements 30 are re-bound on the spare conductive pad units 12 corresponding to the light-emitting elements 30 that cannot emit light to replace the light-emitting elements 30 that cannot emit light. Therefore, when all the light-emitting elements 30 electrically connected to the main conductive pad units 11 can emit light normally, the light-emitting elements 30 on the display panel 200 are all electrically connected to the main conductive pad units 11. When part of the light-emitting elements 30 electrically connected to the main conductive pad units 11 cannot emit light, part of the light-emitting elements 30 electrically connected to the spare conductive pad units 12 appear on the display panel 200. One embodiment shown in FIG. 8 and FIG. 9 is described by taking the display panel 200 in which the light-emitting elements 30 are electrically connected to part of the spare conductive pad units 12 as an example. In the display panel 200, the anti-reflection layer 20 is disposed on a side of the spare conductive pad unit 12 that is not electrically connected to the light-emitting element 30 away from the supporting base P. The part of the spare conductive pad units 12 are covered by the anti-reflective layers 20 to avoid an increase in a reflectivity of the display panel 200 due to an introduction of the spare conductive pad units 12 to affect normal display. Therefore, it is conducive to improve display effect of the display panel 200 after the spare conductive pad units 12 are introduced.

Figure 10:
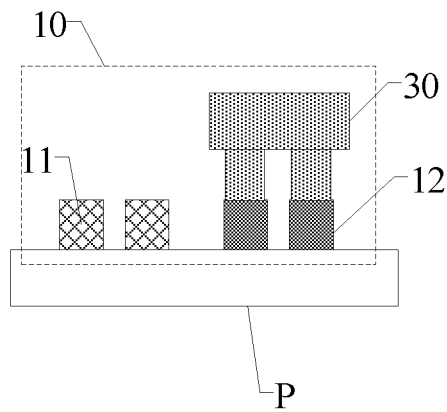
FIG. 10 illustrates a CC' cross-sectional view of the display panel in FIG. 8.

Optionally, in one embodiment, FIG. 10 illustrates a CC' cross-sectional view of the display panel in FIG. 8. When the light-emitting element 30 is electrically connected to the spare conductive pad unit 12, an orthographic projection of the spare conductive pad unit 12 electrically connected to the light-emitting element 30 on the supporting base P does not overlap with an orthographic projection of the anti-reflection layer on the supporting base P.

Specifically, referring to FIG. 10, when the light-emitting element 30 needs to be electrically connected to the spare conductive pad unit 12, an anti-reflection layer originally covering the spare conductive pad unit 12 can be removed to expose the spare conductive pad unit 12. An electrical connection between the light emitting elements 30 and the spare conductive pad unit 12 is realized. There is no anti-reflection layer between the light-emitting element 30 and the spare conductive pad unit 12. That is, the orthographic projection of the spare conductive pad unit 12 electrically connected to the light-emitting element 30 on the substrate P does not overlap with the orthographic projection of the anti-reflection layer on the supporting base P. The above design is conducive to improve reliability of the electrical connection between the light-emitting element 30 and the spare conductive pad unit 12, thereby helping to improve reliability of the light-emitting element.

Figure 11:
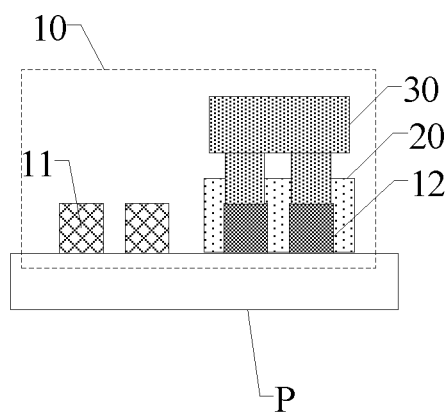
FIG. 11 illustrates another CC' cross-sectional view of the display panel in FIG. 8.

Optionally, in one embodiment, FIG. 11 illustrates another CC' cross-sectional view of the display panel 200 in FIG. 8. When the light emitting element 30 is electrically connected to the spare conductive pad unit 12, in a direction perpendicular to a surface of the supporting base P, the anti-reflection layer 20 is disposed between the light emitting elements 30 and the spare conductive pad unit 12. The light emitting elements 30 and the spare conductive pad unit 12 are electrically connected by bonding.

Specifically, FIG. 11 illustrates that the anti-reflection layer 20 originally covering the spare conductive pad unit 12 is not removed when the light-emitting element 30 is electrically connected to the spare conductive pad unit 12. The light-emitting element 30 and the spare conductive pad unit 12 are electrically connected by bonding. Electrodes in the light-emitting element 30 penetrate the anti-reflective layer 20 between the light-emitting element 30 and the spare conductive pad unit 12 and contact the spare conductive pad unit 12 by crimping to form an electrical connection. When the anti-reflection layer 20 is disposed between the light-emitting element 30 and the spare conductive pad unit 12, a thicknesses of the anti-reflection layer 20 on a surface of the spare conductive pad unit 12 away from the substrate P is preferably less than a length of each electrode of the light-emitting element 30 to ensure that the electrodes of the light-emitting element 30 can reliably contact the spare conductive pad unit 12 to form a reliable electrical connection. When the anti-reflection layer 20 on a side of the spare conductive pad unit 12 away from the supporting base P is not removed to achieve an electrical connection between the light-emitting element 30 and the spare conductive pad unit 12, the anti-reflection layer 20 still covers the spare conductive pad unit 12. Therefore, it is conducive to reduce the reflectivity of the display panel 200 and improve display effect of the display panel 200.

Figure 12:
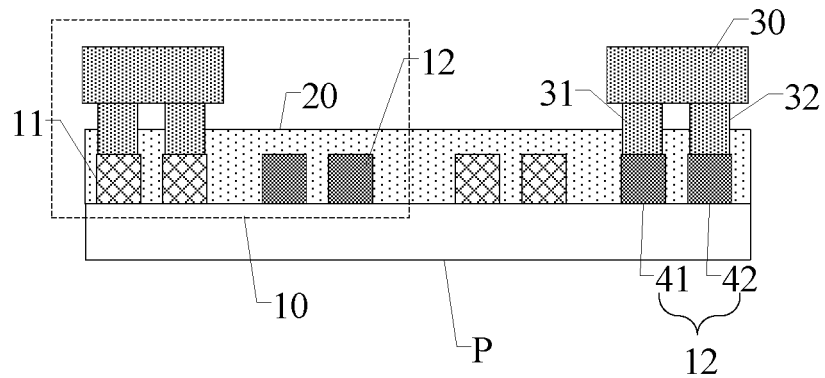
FIG. 12 illustrates another BB' cross-sectional view of the display panel in FIG. 8.

Optionally, in one embodiment, FIG. 12 illustrates another BB' cross-sectional view of the display panel in FIG. 8. the orthographic projection of the anti-reflection layer 20 on the supporting base P covers the orthographic projection of the main conductive pad unit 11 on the supporting base P. When the light-emitting element 30 is electrically connected to the main conductive pad unit 11, in a direction perpendicular to a surface of the supporting base P, the anti-reflection layer 20 is disposed between the light-emitting element 30 and the main conductive pad unit 11. The light-emitting element 30 and the main conductive pad unit 11 are electrically connected by bonding.

Specifically, FIG. 12 illustrates that the anti-reflection layer 20 simultaneously covers the main conductive pad unit 11 and the spare conductive pad unit 12 in the sub-pixel area 10. When the main conductive pad unit 11 is covered by the anti-reflection layer 20, the anti-reflection layer 20 is disposed between the light-emitting element 30 and the main conductive pad unit 11. When an electrical connection is formed between the light-emitting element 30 and the main conductive pad unit 11, the light-emitting element 30 and the main conductive pad unit 11 are electrically connected by bonding. Electrodes of the light-emitting element 30 penetrate through the anti-reflection layer 20 between the light-emitting element 30 and the main conductive pad unit 11 to contact the main conductive pad unit 11 to form the electrical connection. When the anti-reflection layer 20 is disposed between the light-emitting element 30 and the main conductive pad unit 11, the thickness of the anti-reflection layer 20 on the surface of the main conductive pad unit 11 away from the supporting base P is preferably less than a length of each electrode of the light-emitting element 30 to ensure that the electrodes of the light-emitting element 30 can reliably contact the main conductive pad unit 11 to form a reliable electrical connection. When the anti-reflection layer 20 on a side of the main conductive pad unit 11 away from the supporting base P is not removed to achieve the electrical connection between the light-emitting element 30 and the main conductive pad unit 11, the anti-reflection layer 20 still covers the main conductive pad unit 11. Therefore, it is conducive to reduce the reflectivity of the display panel 200 and improve display effect of the display panel 200.

Referring to FIG. 12, when the anti-reflection layer 20 is disposed between the light-emitting element 30 and the spare conductive pad unit 12 or the main conductive pad unit 11, the anti-reflection layer 20 is preferably an organic resin or colloid doped with carbon black. The organic resin or colloid has a certain elasticity, which is conducive for the electrodes of the light-emitting element 30 to reliably penetrate the anti-reflection layer 20 to form an electrical connection with the spare conductive pad unit 12 or the main conductive pad unit 11.

Figure 13:
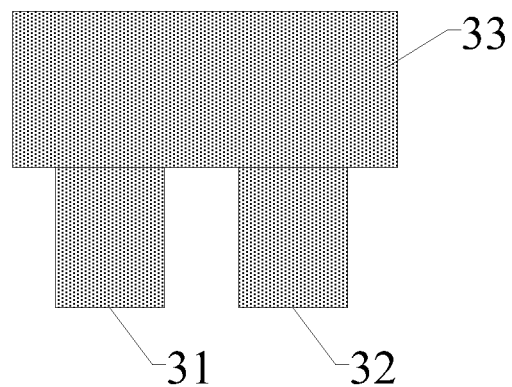
FIG. 13 illustrates a schematic diagram of an exemplary light-emitting element in a display panel consistent with various disclosed embodiments of the present disclosure.

Optionally, in one embodiment, FIG. 13 illustrates a schematic diagram of an exemplary light-emitting element in a display panel consistent with various disclosed embodiments of the present disclosure. Referring to FIG. 12 and FIG. 13, the light-emitting element 30 includes a light-emitting body 33, a first electrode 31 and a second electrode 32. The first electrode 31 and the second electrode 32 are electrically connected to the light-emitting body respectively and are on a same side of the light-emitting body.

Each of the main conductive pad unit 11 and the spare conductive pad unit 12 includes a first conductive pad 41 and a second conductive pad 42. When the light-emitting element 30 is electrically connected to the main conductive pad unit 11 or the spare conductive pad unit 12, the first conductive pad 41 is electrically connected to the first electrode 31. The second conductive pad 42 is electrically connected to the second electrode 32.

Specifically, number of conductive pads in the main conductive pad unit 11 or the spare conductive pad unit 12 is related to type of the light-emitting element 30. FIG. 13 illustrates a schematic diagram of the light-emitting element 30 of a flip-chip structure. The first electrode 31 and the second electrode 32 in the light-emitting element 30 of the flip-chip structure are on a same side of the light-emitting body 33. The main conductive pad unit 11 or the spare conductive pad unit 12 corresponding to the flip-chip structure includes two conductive pads. Referring to FIG. 12, when the light emitting element 30 is electrically connected to the main conductive pad unit 11 or the spare conductive pad unit 12, the first electrode 31 of the light emitting element 30 is electrically connected to the first conductive pad 41. The second electrode 32 is electrically connected to the second conductive pad 42. An electrical connection process between the first electrode 31 and the first conductive pad 41 and an electrical connection process between the second electrode 32 and the second conductive pad 42 can be completed at a same time. Therefore, the light-emitting element 30 of the flip-chip structure is conducive to simplify an electrical connection process between the light-emitting element 30 and the substrate 100 in the display panel 200, and is conducive to improve production efficiency of the display panel 200.

Figure 14:
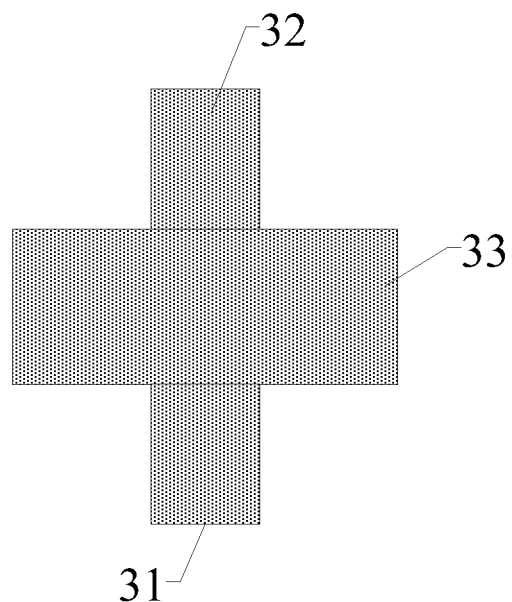
FIG. 14 illustrates another schematic diagram of an exemplary light-emitting element in a display panel consistent with various disclosed embodiments of the present disclosure.
Figure 15:
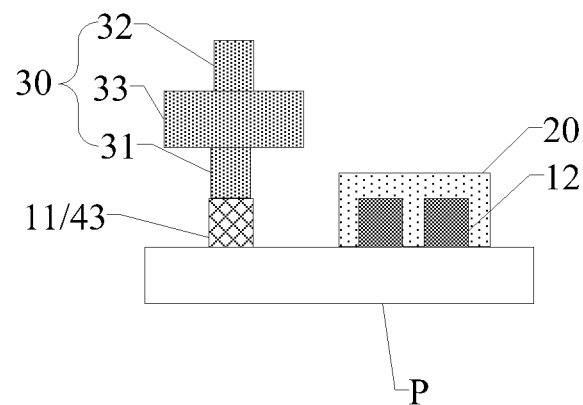
FIG. 15 illustrates a schematic diagram of an exemplary electrical connection between a light-emitting element and a main conductive pad unit in FIG. 14.

Optionally, in one embodiment, FIG. 14 illustrates another schematic diagram of the light-emitting element 30 in the display panel 200 consistent with various disclosed embodiments of the present disclosure. FIG. 15 illustrates a schematic diagram of an exemplary electrical connection between the light-emitting element 30 and the main conductive pad unit 11 in FIG. 14. The light-emitting element 30 includes a light-emitting body 33, a first electrode 31 and a second electrode 32. The first electrode 31 and the second electrode 32 are electrically connected to the light-emitting body 33 respectively and are on two sides of the light-emitting body 33 respectively.

Each of the main conductive pad unit 11 and the spare conductive pad unit 12 includes a third conductive pad 43. When the light-emitting element 30 is electrically connected to the main conductive pad unit 11 or the spare conductive pad unit 12, the third conductive pad 43 is electrically connected to one of the first electrode 31 and the second electrode 32.

Specifically, FIG. 14 illustrates a schematic diagram of a light-emitting element 30 of a vertical structure. In the light-emitting element 30 of the vertical structure, the first electrode 31 and the second electrode 32 are on two sides of the light-emitting body 33 respectively. When the light-emitting element 30 of the vertical structure is electrically connected to the main conductive pad unit 11, the main conductive pad unit 11 includes only one third conductive pad 43. The first electrode 31 in the light-emitting element 30 is electrically connected to the third conductive pad 43 unit. When different electrical signals are provided to the first electrode 31 and the second electrode 32 of the light-emitting element 30 respectively, the light-emitting element 30 can be driven to emit light. When one of the first electrode 31 and the second electrode 32 of the light-emitting element 30 is electrically connected to the third conductive pad 43, it is also necessary to electrically connect the other of the first electrode 31 and the second electrode 32 to a signal trace 70. Therefore, different signals are provided to the first electrode 31 and the second electrode 32 by the signal trace 70 and the third conductive pad 43 to drive the light emitting element 30 to emit light.

Figure 16:
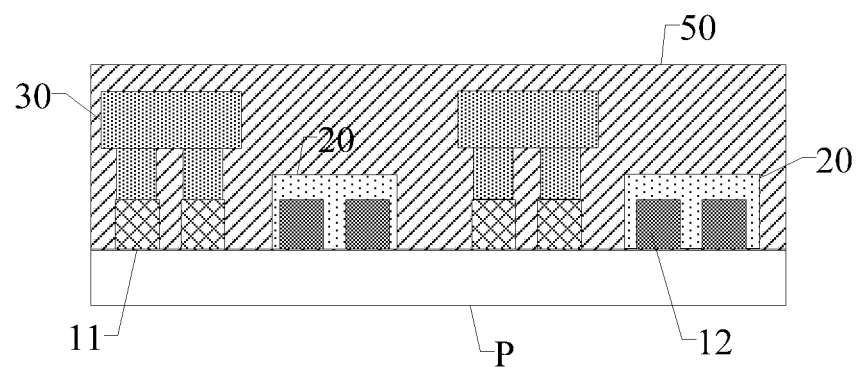
FIG. 16 illustrates a schematic diagram of encapsulating light-emitting elements with an encapsulation layer consistent with various disclosed embodiments of the present disclosure.

Optionally, in one embodiment, FIG. 16 illustrates a schematic diagram of encapsulating the light-emitting elements 30 with an encapsulation layer 50 consistent with various disclosed embodiments of the present disclosure. The display panel 200 further includes the encapsulation layer 50 disposed on a side of the light emitting element 30 away from the main conductive pad unit 11 or the spare conductive pad unit 12. An orthographic projection of the encapsulation layer 50 on the supporting base P covers the supporting base P.

Specifically, referring to FIG. 16, in the display panel 200, the light-emitting elements 30 are encapsulated by the encapsulation layer 50. An orthographic projection of the encapsulation layer 50 on the supporting base P covers the supporting base P. The encapsulation layer 50 can effectively block external moisture and oxygen from entering the light-emitting elements 30 to prevent external moisture and oxygen from affecting normal light emissions of the light-emitting elements 30, thereby helping to improve light-emitting reliability of the light-emitting elements 30 in the display panel 200.

Figure 17:
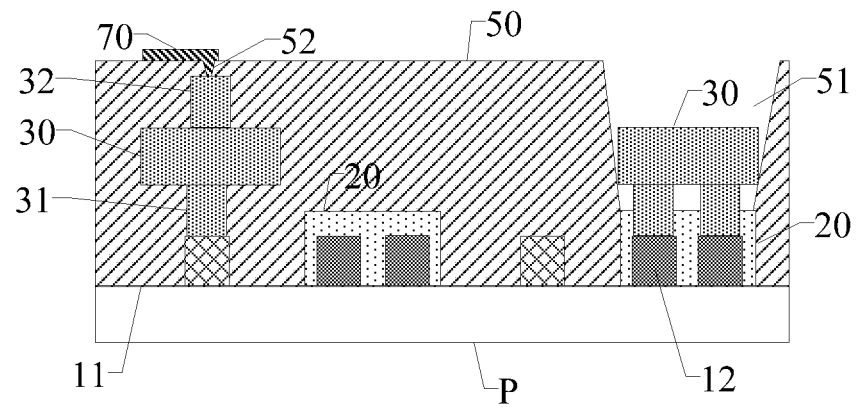
FIG. 17 illustrates another schematic diagram of encapsulating a light-emitting element with an encapsulation layer consistent with various disclosed embodiments of the present disclosure.

Optionally, in one embodiment, FIG. 17 illustrates another schematic diagram of encapsulating the light-emitting elements 30 with the encapsulation layer 50 consistent with various disclosed embodiments of the present disclosure. When the light-emitting element 30 is electrically connected to the spare conductive pad unit 12, the encapsulation layer 50 includes a first groove 51. The first groove 51 exposes the spare conductive pad unit 12 or exposes the anti-reflective layer 20 corresponding to the spare conductive pad unit 12. At least part of the light-emitting elements 30 are disposed in the first groove 51.

Specifically, FIG. 17 illustrates a schematic diagram of the encapsulation layer 50 encapsulating the light-emitting elements 30 when the light-emitting elements 30 of a vertical structure are electrically connected to the substrate 100. The light emitting element 30 of the vertical structure is electrically connected to the spare conductive pad unit 12. When the light-emitting element 30 is not electrically connected to the spare conductive pad unit 12, a side of the spare conductive pad away from the supporting base P is covered by the encapsulation layer 50. When it is necessary to electrically connect the light-emitting element 30 to a spare conductive pad, at least part of the encapsulation layer 50 on a surface of the spare conductive pad unit 12 away from the supporting base P needs to be removed to form the first groove 51 shown in FIG. 17. The first groove 51 exposes the spare conductive pad unit 12 or exposes the anti-reflection layer 20 corresponding to the spare conductive pad unit 12. FIG. 17 illustrates that the first groove 51 directly exposes the anti-reflection layer 20 corresponding to the spare conductive pad unit 12. The light-emitting element 30 is disposed in the first groove 51 to realize an electrical connection with the spare conductive pad unit 12 by crimp bonding. Referring to FIG. 17, when the light-emitting element 30 of the vertical structure is electrically connected to the main conductive pad unit 11, an electrode (e.g. first electrode 31 in FIG. 17) in the light-emitting element 30 is electrically connected to a conductive pad in the main conductive pad unit 11. At a same time, another groove (e.g. second groove 52 in FIG. 17) needs to be formed in the encapsulation layer 50 to expose an electrode (e.g. second electrode 32 in FIG. 17) of the light-emitting element 30 that is not electrically connected to the main conductive pad unit 11. Thereby, the electrode (second electrode 32 in FIG. 17) can be electrically connected to an external signal trace 70, so that the main conductive pad unit 11 and the external signal trace 70 can drive the light-emitting element 30 together. The encapsulation layer can be processed by laser drilling to form the first groove 51 and the second groove 52 in the encapsulation layer.

Optionally, in one embodiment, the light emitting element 30 includes a Mini LED or a Micro LED. Specifically, in the display panel 200, the Mini LED or the Micro LED is applied as the light-emitting element 30, so that the display panel 200 has advantages of high brightness, low power consumption, high and low temperature resistance, and longer life.

Figure 18:
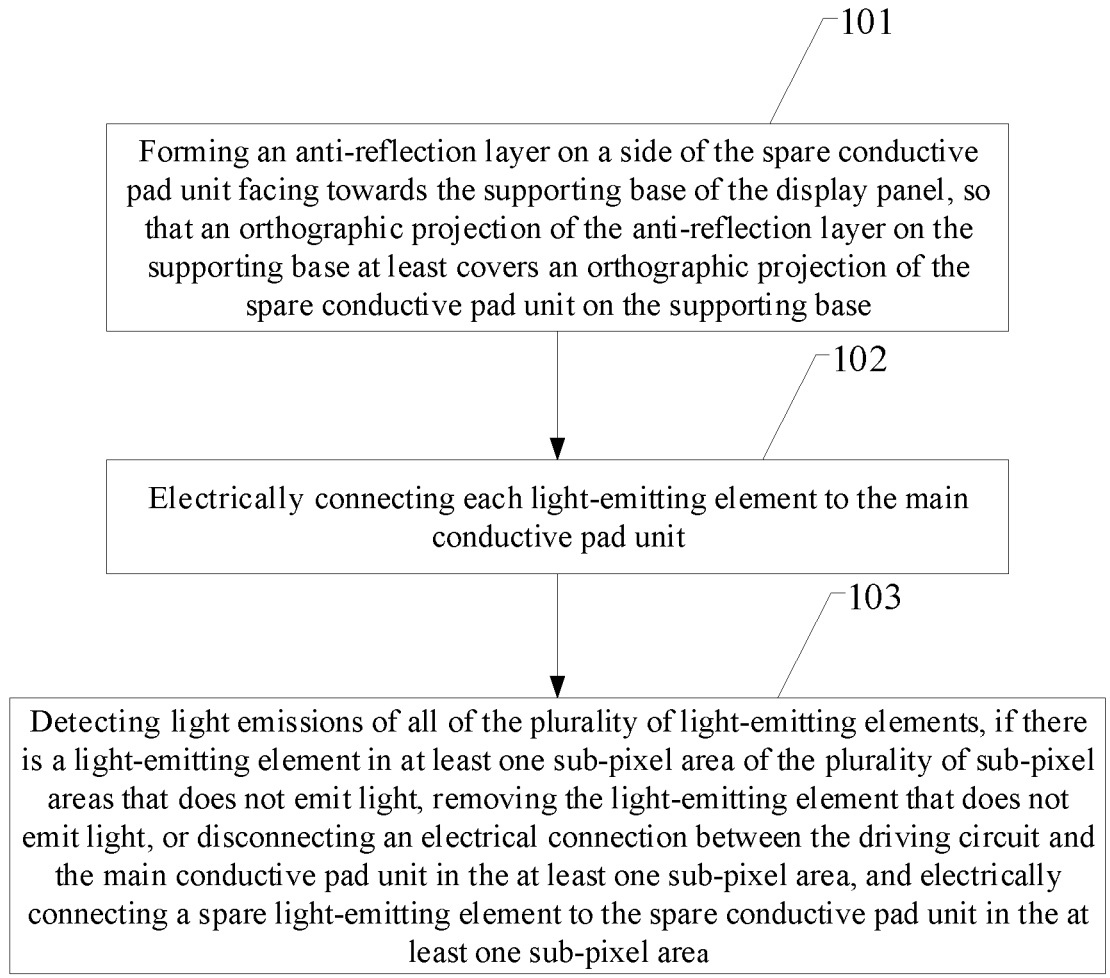
FIG. 18 illustrates a flow chart of an assembly detection method of a display panel consistent with various disclosed embodiments of the present disclosure.
Figure 19:
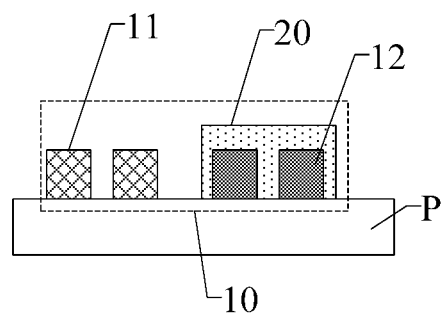
FIG. 19 illustrates a schematic diagram of forming an anti-reflection layer on a side of a spare conductive pad unit away from a supporting base consistent with various disclosed embodiments of the present disclosure.

Based on a same inventive concept, an assembly detection method of the display panel 200 is provided in one embodiment. FIG. 18 illustrates a flow chart of the assembly detection method of the display panel 200 consistent with various disclosed embodiments of the present disclosure. The assembly detection method is applied to the display panel 200 provided by any of the above embodiments. The main conductive pad unit 11 and the spare conductive pad unit 12 in a same sub-pixel area 10 are electrically connected to a same driving circuit 60. Referring to FIGS. 8-9 and FIG. 18, the assembly detection method includes:

S101: forming the anti-reflection layer 20 on a side of the spare conductive pad unit 12 facing towards the supporting base P of the display panel 200, so that the orthographic projection of the anti-reflection layer 20 on the supporting base P at least covers an orthographic projection of the spare conductive pad unit 12 on the supporting base P. Referring to FIG. 19, FIG. 19 illustrates a schematic diagram of forming an anti-reflection layer on a side of a spare conductive pad unit away from a supporting base consistent with various disclosed embodiments of the present disclosure.

Figure 20:
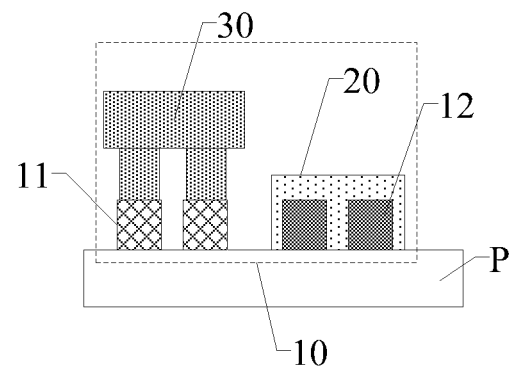
FIG. 20 illustrates a schematic diagram of electrically connecting a light-emitting element to a main conductive pad unit consistent with various disclosed embodiments of the present disclosure.

S102: electrically connecting each light-emitting element 30 to the main conductive pad unit 11. Referring to FIG. 20, FIG. 20 illustrates a schematic diagram of electrically connecting a light-emitting element to a main conductive pad unit consistent with various disclosed embodiments of the present disclosure.

Figure 21:
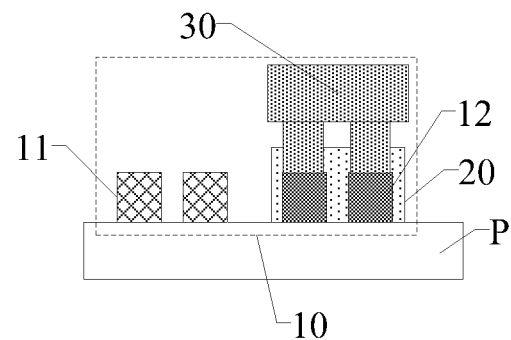
FIG. 21 illustrates a schematic diagram of electrically connecting a spare light-emitting element to a spare conductive pad unit consistent with various disclosed embodiments of the present disclosure.

S103: detecting light emissions of all of the plurality of light-emitting elements 30; if there is a light-emitting element 30 in at least one sub-pixel area 10 of the plurality of sub-pixel areas that does not emit light, removing the light-emitting elements 30 that do not emit light, or disconnecting an electrical connection between the driving circuits 60 and the main conductive pad unit 11 in the sub-pixel areas 10; and electrically connecting a spare light-emitting element 30 to the spare conductive pad unit 12 in the at least one sub-pixel area 10. Referring to FIG. 21, FIG. 21 illustrates a schematic diagram of electrically connecting a spare light-emitting element to a spare conductive pad unit consistent with various disclosed embodiments of the present disclosure. FIG. 21 illustrates a solution of removing a light-emitting element that is originally electrically connected to a main conductive pad unit and binding a spare light-emitting element on a corresponding spare conductive pad unit.

Figure 22:
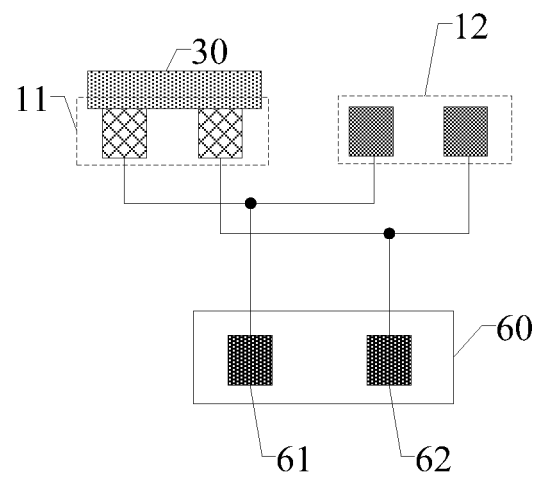
FIG. 22 illustrates a connection diagram when a light-emitting element and a main conductive pad unit are bound consistent with various disclosed embodiments of the present disclosure.
Figure 23:
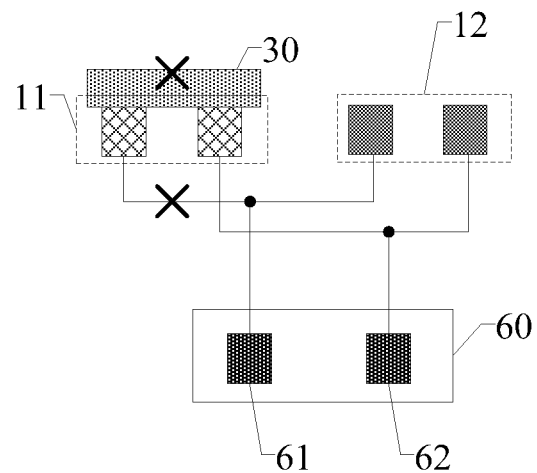
FIG. 23 illustrates a schematic diagram of cutting off an electrical connection between a main conductive pad unit and a driving circuit when it is detected that a light-emitting element does not emit light consistent with various disclosed embodiments of the present disclosure.
Figure 24:
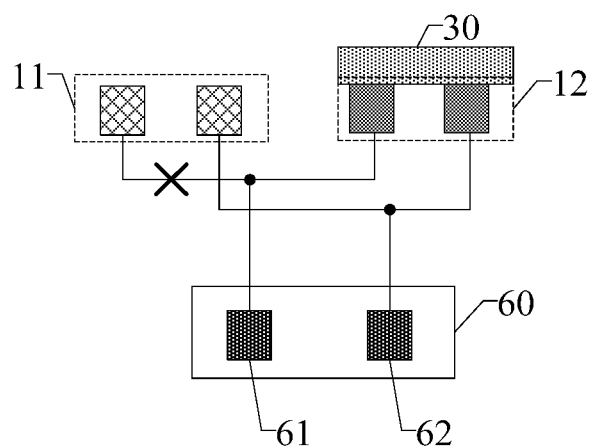
FIG. 24 illustrates a schematic diagram of binding a spare light-emitting element on a spare conductive pad unit consistent with various disclosed embodiments of the present disclosure.

Specifically, a detection process of the display panel 200 is described below with reference to FIGS. 22-24. FIG. 22 illustrates a connection relationship diagram when the light-emitting element 30 and the main conductive pad unit 11 are bound consistent with various disclosed embodiments of the present disclosure. FIG. 23 illustrates a schematic diagram of cutting off an electrical connection between the main conductive pad unit 11 and the driving circuit 60 when it is detected that the light emitting element 30 does not emit light consistent with various disclosed embodiments of the present disclosure. FIG. 24 illustrates a schematic diagram of binding the spare light-emitting element 30 on the spare conductive pad unit 12 consistent with various disclosed embodiments of the present disclosure. Referring to FIG. 22, a driving circuit includes a first output terminal 61 and a second output terminal 62. A first conductive pad in the main conductive pad unit 11 and a first conductive pad in the spare conductive pad unit 12 are electrically connected to the first output terminal 61 respectively. A second conductive pad in the main conductive pad unit 11 and a second conductive pad in the spare conductive pad unit 12 are electrically connected to the second output terminal 62 respectively. After the substrate 100 is produced, the light-emitting elements 30 are usually transferred onto the substrate 100 by means of mass transfer. Each light-emitting element 30 is electrically connected to the main conductive pad unit 11 on the substrate 100. Referring to FIG. 23, light emissions of all the light-emitting elements 30 are detected. When it is detected that one light-emitting element 30 does not emit light, an electrical connection between the main conductive pad unit 11 and the drive circuit 60 corresponding to the light-emitting element 30 that does not emit light can be disconnected by laser cutting. Referring to FIG. 24, a spare light-emitting element 30 is bound to the spare conductive gasket unit 12, thereby realizing repair of the display panel 200. The light-emitting element 30 that does not emit light on the main conductive pad unit 11 can be removed or can be left in its original position. FIG. 24 illustrates a solution of removing a light-emitting element that does not emit light.

In the display panel 200 that completes an assemble detection, the anti-reflection layer 20 is disposed on a side of the spare conductive pad unit 12 that is not electrically connected to the light-emitting element 30 away from the supporting base P. The anti-reflective layer 20 is used to cover part of the spare conductive pad units 12 to prevent an increase in the reflectivity of the display panel 200 due to an introduction of the spare conductive pad units 12 to affect normal display of the display panel 200, thereby helping to improve display effect of the display panel 200 after the spare conductive pad units 12 are introduced.

Optionally, in one embodiment, the spare light-emitting element 30 and the spare conductive pad unit 12 in the at least one sub-pixel area 10 are electrically connected by bonding.

Specifically, referring to FIG. 11, FIG. 11 illustrates that when the light-emitting element 30 is electrically connected to the spare conductive pad unit 12, the anti-reflection layer 20 originally covering the spare conductive pad unit 12 is not removed. Therefore the light-emitting element 30 and the spare conductive pad unit 12 are electrically connected by bonding. Electrodes in the light-emitting element 30 penetrate the anti-reflection layer 20 between the light-emitting element 30 and the spare conductive pad unit 12 and contact the spare conductive pad unit 12 to form an electrical connection. When the anti-reflection layer 20 is disposed between the light-emitting element 30 and the spare conductive pad unit 12, the thickness of the anti-reflection layer 20 on a side of the spare conductive pad unit 12 away from the substrate P is preferably smaller than a length of each electrode of the light-emitting element 30 to ensure that the electrodes of the light-emitting element 30 can reliably contact the spare conductive pad unit 12 to form a reliable electrical connection. When the anti-reflection layer 20 on the side of the spare conductive pad unit 12 away from the substrate P is not removed to achieve the electrical connection between the light-emitting element 30 and the spare conductive pad unit 12, The anti-reflection layer 20 still covers the spare conductive pad unit 12, thereby helping to reduce the reflectivity of the display panel 200 and improving display effect of the display panel 200.

Optionally, in one embodiment, In the above step 103, before the spare light-emitting element 30 is electrically connected to the spare conductive pad unit 12 in the at least one sub-pixel area 10, the method further includes: illuminating or heating the anti-reflection layer 20 corresponding to the spare conductive pad unit 12 in the at least one sub-pixel area 10 to decompose the anti-reflective layer 20 corresponding to the spare conductive pad unit 12 in the at least one sub-pixel area 10, thereby exposing the spare conductive pad unit 12.

Specifically, referring to FIG. 10, when the light-emitting element 30 needs to be electrically connected to the spare conductive pad unit 12, an anti-reflection layer originally covering the spare conductive pad unit 12 can be removed to expose the spare conductive pad unit 12. An electrical connection between the light emitting element 30 and the spare conductive pad unit 12 is realized. Therefore, there is no anti-reflection layer between the light-emitting element 30 and the spare conductive pad unit 12. That is, an orthographic projection of the spare conductive pad unit 12 electrically connected to the light-emitting element 30 on the supporting base P does not overlap with the orthographic projection of the anti-reflection layer 20 on the supporting base P. The above design is conducive to improve reliability of the electrical connection between the light-emitting element 30 and the spare conductive pad unit 12. Since the anti-reflective layer is a photolytic or a pyrolytic material, the anti-reflective layer on the corresponding spare conductive pad unit 12 can be processed by illuminating or heating, so that part of the anti-reflective layers 20 are decomposed to expose the spare conductive pad units 12.

Optionally, in one embodiment, referring to FIG. 16, the light emitting element 30 includes a light emitting body 33, a first electrode 31 and a second electrode 32. The first electrode 31 and the second electrode 32 are electrically connected to the light emitting body 33 respectively, and are on a same side of the light-emitting body 33. After detecting the light emissions of all of the plurality of light-emitting elements 30, the assemble detection method further includes: forming an encapsulation layer 50 on a side of the plurality of light-emitting elements 30 away from the main conductive pad unit 11 or the spare conductive pad unit 12 so that an orthographic projection of the encapsulation layer 50 on the supporting base P covers the supporting base P.

Specifically, referring to FIG. 16, in the display panel 200, the light-emitting elements 30 are encapsulated by the encapsulation layer 50. An orthographic projection of the encapsulation layer 50 on the supporting base P covers the supporting base P. The encapsulation layer 50 can effectively block external moisture and oxygen from entering the light-emitting elements 30, and prevent external moisture and oxygen from affecting normal light emissions of the light-emitting elements 30, thereby helping to improve light-emitting reliability of the light-emitting elements 30 in the display panel 200. When the light-emitting element 30 is a light-emitting element 30 of a flip-chip structure, that is, when the first electrode 31 and the second electrode 32 of the light-emitting element 30 are both on a same side of the light-emitting body 33, after light emissions of all the light-emitting elements 30 are detected, if any light-emitting element 30 does not emit light, a spare light-emitting element 30 is bound on the spare conductive pad. The light-emitting elements 30 are encapsulated on a side of all the light-emitting elements 30 away from the supporting base P. That is, for the light-emitting elements 30 of the flip-chip structure, the detection can be completed before unified encapsulation. The flip-chip structure is conducive to simplify a detection and encapsulation process of the display panel 200 and improve production efficiency of the display panel 20.

Optionally, in one embodiment, with reference to FIG. 17, The light emitting element 30 includes a light emitting body 33, a first electrode 31 and a second electrode 32. The first electrode 31 and the second electrode 32 are electrically connected to the light emitting body 33 respectively and are on two sides of the light emitting body 33 respectively.

In the above S102, each light-emitting element 30 is electrically connected to the main conductive pad unit 11. Specifically, the first electrode 31 of each light-emitting element 30 is electrically connected to the main conductive pad unit 11.

Before detecting the light emissions of all of the plurality of light-emitting elements 30, the method further includes: forming an encapsulation layer 50 on a side of the plurality of light-emitting elements 30 away from the main conductive pad unit 11 or the spare conductive pad unit 12, so that an orthographic projection of the encapsulation layer 50 on the supporting base P covers the supporting base P; and forming a first groove 51 and a second groove 52 in the encapsulation layer 50, the first groove 51 exposing the spare conductive pad unit 12 or exposing the anti-reflection layer 20 corresponding to the spare conductive pad unit 12, the second groove 52 exposing the second electrode 32 of the light emitting element 30.

Specifically, referring to FIG. 17, when the light-emitting element 30 is a vertical structure, that is, when the first electrode 31 and the second electrode 32 of the light-emitting element 30 are on two sides of the light-emitting body 33 respectively, an encapsulation operation of the light-emitting element 30 is performed before a detection operation. After the first electrode 31 of the light-emitting element 30 is electrically connected to the main conductive pad unit 11, the light-emitting element 30 is encapsulated by the encapsulation layer 50. The second groove 52 is formed in the encapsulation layer 50 to expose the second electrode 32 of the light-emitting element 30, to achieve an electrical connection between the second electrode 32 and the external signal trace 70. Therefore, a driving signal can be provided to the light-emitting element 30 through the main conductive pad unit 11 and the external signal trace 70 to control the light-emitting element 30 to emit light. When detecting light emissions of the light-emitting elements 30, if one light-emitting element 30 is found not to emit light, the first groove 51 is formed in the encapsulation layer 50 on the corresponding spare conductive pad unit 12. The first groove 51 exposes the spare conductive pad unit 12 or exposes the anti-reflection layer 20 corresponding to the spare conductive pad unit 12. The light-emitting element 30 is disposed in the first groove 51 to realize an electrical connection between the light-emitting element 30 and the spare conductive pad unit 12.

In summary, a substrate, a display panel and an assembly detection method thereof provided by the present disclosure achieve at least following beneficial effects.

In the substrate, the display panel and the assembly detection method thereof provided by the present disclosure, the substrate includes a supporting base and a plurality of sub-pixel areas arranged in an array. A main conductive pad unit and a spare conductive pad unit are formed on the supporting base in each sub-pixel area. An anti-reflection layer is disposed on a side of the supporting base adjacent to the main conductive pad unit and the spare conductive pad unit. An orthographic projection of the anti-reflection layer on the supporting base at least covers an orthographic projection of the spare conductive pad unit on the supporting base, thereby effectively avoiding an increase in substrate reflectivity due to an introduction of the spare conductive pad unit. In the display panel, even after part of the spare conductive pad units are electrically connected to the light emitting element, the other spare conductive pad unit that are not electrically connected to the light emitting element are further covered by the anti-reflection layer on a side adjacent to a light emitting surface of the display panel. Therefore, it is conducive to reduce a reflectivity of the display panel, and avoid high reflectivity of the display panel from affecting normal display of the display panel, thereby helping to improve display effect of the display panel.

Although some specific embodiments of the present disclosure have been described in detail through examples, those skilled in the art should understand that the above examples are only for illustration, not for limiting the scope of the present disclosure. Those skilled in the art should understand that the above embodiments can be modified without departing from the scope and spirit of the present disclosure. The scope of the disclosure is defined by the appended claims.

What is claimed is:

1. A substrate, comprising:
a supporting base; and
a plurality of sub-pixel areas arranged in an array, wherein:
a main conductive pad unit and a spare conductive pad unit are formed on the supporting base in each sub-pixel area, an anti-reflection layer is disposed on a side of the supporting base adjacent to the main conductive pad unit and the spare conductive pad unit, and an orthographic projection of the anti-reflection layer on the supporting base at least covers an orthographic projection of the spare conductive pad unit on the supporting base.

2. The substrate according to claim 1, wherein the orthographic projection of the anti-reflection layer on the supporting base further covers an orthographic projection of the main conductive pad unit on the supporting base.

3. The substrate according to claim 1, wherein the orthographic projection of the anti-reflection layer on the supporting base further covers an entire surface of the supporting base.

4. The substrate according to claim 3, wherein the sub-pixel area further includes a first area between the main conductive pad unit and the spare conductive pad unit, and a first portion of the anti-reflection layer in the first area is not connected to a second portion of the anti-reflection layer on a side of the spare conductive pad unit away from the supporting base.

5. The substrate according to claim 1, wherein in a direction perpendicular to a surface of the supporting base, a thickness of the anti-reflection layer is at least greater than a thickness of the spare conductive pad unit.

6. The substrate according to claim 1, wherein the anti-reflection layer is black and includes a photolysis material or a pyrolysis material.

7. The substrate according to claim 1, wherein the main conductive pad unit includes one or two conductive pads, and the spare conductive pad unit includes one or two conductive pads.

8. A display panel, comprising:
a substrate, including:
a supporting base, and
a plurality of sub-pixel areas arranged in an array, wherein:
a main conductive pad unit and a spare conductive pad unit are formed on the supporting base in each sub-pixel area, and
an anti-reflection layer is disposed on a side of the supporting base adjacent to the main conductive pad unit and the spare conductive pad unit, and
an orthographic projection of the anti-reflection layer on the supporting base at least covers an orthographic projection of the spare conductive pad unit on the supporting base; and
a plurality of light-emitting elements, disposed in one-to-one correspondence with the plurality of sub-pixel areas, wherein:
the light-emitting element is disposed on a side of the anti-reflection layer away from the supporting base, the light-emitting element is electrically connected to the main conductive pad unit or the spare conductive pad unit in the sub-pixel area.

9. The display panel according to claim 8, wherein when the light-emitting element is electrically connected to the spare conductive pad unit, an orthographic projection of the spare conductive pad unit electrically connected to the light-emitting element on the supporting base and an orthographic projection of the anti-reflection layer on the supporting base do not overlap.

10. The display panel according to claim 8, wherein when the light-emitting element is electrically connected to the spare conductive pad unit, in a direction perpendicular to a surface of the supporting base, the anti-reflection layer is disposed between the light-emitting element and the spare conductive pad unit, and the light-emitting element and the spare conductive pad unit are electrically connected by bonding.

11. The display panel according to claim 8, wherein:
an orthographic projection of the anti-reflection layer on the supporting base covers the orthographic projection of the main conductive pad unit on the supporting base; and
when the light-emitting element and the main conductive pad unit are electrically connected, in a direction perpendicular to a surface of the supporting base, the anti-reflection layer is disposed between the light-emitting element and the spare conductive pad unit, the light-emitting element and the spare conductive pad unit are electrically connected by bonding.

12. The display panel according to claim 8, wherein:
the light-emitting element includes a light-emitting body, a first electrode, and a second electrode, wherein the first electrode and the second electrode are electrically connected to the light-emitting body respectively and are on a same side of the light-emitting body; and
each of the main conductive pad unit and the spare conductive pad unit includes a first conductive pad and a second conductive pad, wherein when the light-emitting element is electrically connected to the main conductive pad unit or the spare conductive pad unit, the first conductive pad is electrically connected to the first electrode, and the second conductive pad is electrically connected to the second electrode.

13. The display panel according to claim 8, wherein:
the light-emitting element includes a light-emitting body, a first electrode, and a second electrode, wherein the first electrode and the second electrode are electrically connected to the light-emitting body respectively and are on two sides of the light-emitting body respectively; and
each of the main conductive pad unit and the spare conductive pad unit includes a third conductive pad, wherein when the light-emitting element is electrically connected to the main conductive pad unit or the spare conductive pad unit, the third conductive pad is electrically connected to one of the first electrode and the second electrode.

14. The display panel according to claim 8, further comprising:
an encapsulation layer, disposed on a side of the light-emitting element away from the main conductive pad unit or the spare conductive pad unit, an orthographic projection of the encapsulation layer on the supporting base covering the supporting base.

15. The display panel according to claim 14, wherein when the light-emitting element is electrically connected to the spare conductive pad unit, the encapsulation layer includes a first groove, the first groove exposes the spare conductive pad unit or exposes an anti-reflective layer corresponding to the spare conductive pad unit, and at least part of the light-emitting element is disposed in the first groove.

16. The display panel according to claim 8, wherein the light-emitting element includes a Mini LED or a Micro LED.

* * * * *